United States Patent
Schluter et al.

(10) Patent No.: US 7,219,809 B2
(45) Date of Patent: May 22, 2007

(54) RELAY RACK

(75) Inventors: Robert Schluter, Tavernier, FL (US); Jeff Provost, Hewitt, NJ (US)

(73) Assignee: Middle Atlantic Products, Inc., Fairfield, NJ (US)

( * ) Notice: Subject to any disclaimer, the term of this patent is extended or adjusted under 35 U.S.C. 154(b) by 247 days.

(21) Appl. No.: 11/088,487

(22) Filed: Mar. 24, 2005

(65) Prior Publication Data

US 2006/0213853 A1 Sep. 28, 2006

(51) Int. Cl.
*A47B 47/00* (2006.01)
*A47G 29/00* (2006.01)

(52) U.S. Cl. .................. 211/189; 312/265.1

(58) Field of Classification Search ............. 211/26, 211/191, 204, 206; 248/121, 126, 500, 910, 248/188, 247, 200, 300, 346.01, 346.5; 312/265.1–265.4
See application file for complete search history.

(56) References Cited

U.S. PATENT DOCUMENTS

| 3,339,504 | A * | 9/1967 | Schreyer | 108/156 |
| 4,088,229 | A * | 5/1978 | Jacoby et al. | 211/191 |
| 5,806,945 | A * | 9/1998 | Anderson et al. | 312/265.3 |
| 6,220,456 | B1 * | 4/2001 | Jensen et al. | 211/26 |
| 6,223,908 | B1 * | 5/2001 | Kurtsman | 211/26 |
| 6,338,413 | B1 * | 1/2002 | Walter et al. | 211/26 |
| 6,347,714 | B1 * | 2/2002 | Fournier et al. | 211/26 |
| 6,349,837 | B1 * | 2/2002 | Serban | 211/26 |
| 6,489,565 | B1 * | 12/2002 | Krietzman et al. | 174/101 |
| 2003/0217526 | A1 * | 11/2003 | Larson | 52/736.4 |
| 2004/0226900 | A1 * | 11/2004 | Canty et al. | 211/26 |

OTHER PUBLICATIONS www.budind.com, Bud Industries, Inc., "*Open Racks Aluminum Rack,*" Date Unknown, pp. 1-3.
www.damac.com, DAMAC Products, Inc., "*Unequal Flange Racks,*" Dec. 2001, pp. 1-3.
Hoffman Enclosures, Inc. Catalog, Bulletin EC2, "*DataCom Seismic 2-Post open Frame Rack*", (copyright 2004).
www.swdp.com, Southwest Data Products, "*Equipment Rack,*" (copyright 2004), pp. 1-2.

* cited by examiner

*Primary Examiner*—Jerry Redman
*Assistant Examiner*—Andrea L. Coulter
(74) *Attorney, Agent, or Firm*—Drinker Biddle & Reath LLP

(57) ABSTRACT

A relay rack includes a base including first and second base brackets. Each base bracket has a vertical base flange attached integrally to a horizontal base flange. First and second support brackets are connected to each base bracket. Each support bracket has a single vertical support and a single horizontal support connected to the vertical support. The support brackets may also include a single vertical end support adapted to be connected to the vertical flange of the base bracket. The vertical support extends along a substantially vertical plane that forms a dihedral angle of less than 90 degrees with the plane of the vertical base flange. In a direction in which the horizontal base flange extends from the vertical base flange, the vertical supports on each base bracket extend convergently toward one another.

14 Claims, 3 Drawing Sheets

RELAY RACK

FIELD OF THE INVENTION

The present invention relates to a relay rack and, more particularly, to an improved base which is designed to facilitate shipment, installation, and rigidity of the rack.

BACKGROUND

Relay racks are generally used to support electrical components. The racks typically include vertical columns or supports, upper and lower cross-brackets and a base. The base includes two heavy gauge angle brackets, typically made from aluminum or steel with a thickness of 0.250 inches or more. The relatively heavy gauge base angles are used to support the relay rack.

A significant problem with these conventional racks is that the heavy base angles add considerable weight to the entire rack, increasing the shipping and assembly costs.

A need exists for a lighter weight base for a relay rack.

SUMMARY OF THE INVENTION

The present invention relates to a relay rack for supporting electrical components. The relay rack includes at least two vertical columns each having upper and lower ends. An upper cross-bracket extends between and is attached to the vertical columns at their upper ends.

A base is attached to the rack to provide support for the rack. The base includes first and second base brackets. Each base bracket has a vertical base flange attached integrally to a horizontal base flange. The vertical base flanges of the base brackets are respectively attached to opposite sides of the lower ends of the vertical columns. The vertical base flanges each extend along a substantially vertical plane. First and second support brackets are connected to each base bracket. Each support bracket has a single vertical support and a single horizontal support connected to the vertical support. The vertical support extends along a substantially vertical plane that forms a dihedral angle of less than 90 degrees with the plane of the vertical base flange. In a direction in which the horizontal base flange extends from the vertical base flange, the vertical supports on each base bracket extend convergently toward one another.

In a second aspect, the support brackets each further include a single vertical end support adapted to be connected to the vertical flange of the base bracket.

BRIEF DESCRIPTION OF THE DRAWINGS

For the purpose of illustrating the invention, there is shown in the drawings forms of the invention that are presently preferred; it being understood, however, that this invention is not limited to the precise arrangements and instrumentalities shown.

DETAILED DESCRIPTION OF THE DRAWINGS

Figure 1:
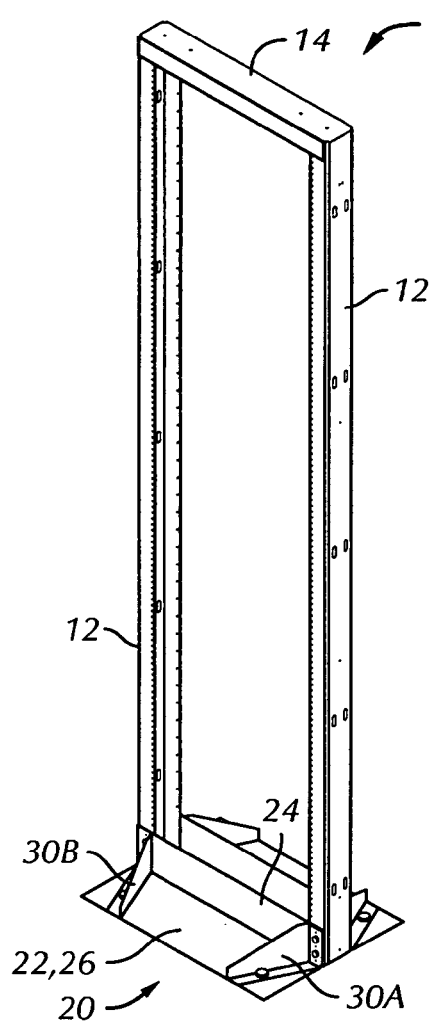
FIG. 1 is a perspective view of a relay rack assembly in accordance with the present invention.
Figure 2:
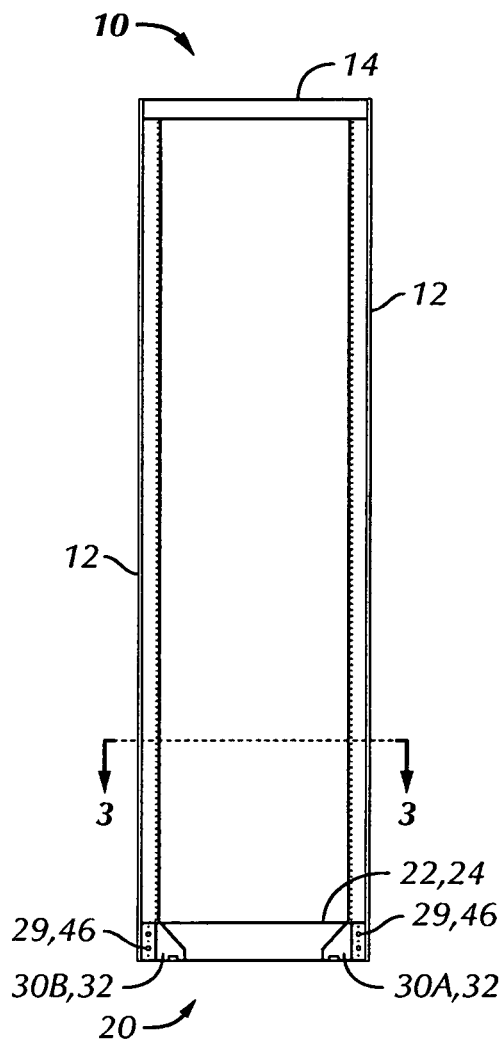
FIG. 2 is a front view of the relay rack assembly of FIG. 1.

Referring now to the drawings wherein like reference numerals indicate similar elements throughout the views, presently preferred embodiments of a relay rack assembly are disclosed. With reference initially to FIGS. 1–4, a first embodiment relay rack assembly 10 includes two or more substantially vertical columns or uprights 12, an upper cross-bracket 14, and a base 20. The uprights 12 preferably have a U-shaped channel cross-section with a plurality of spaced apart holes along the lateral side flanges. The uprights 12 are attached at their upper ends to the cross-bracket 14. The attachment can be through any conventional method, such as welding or fastening.

The rack 10 is preferably compliant with the requirements of the Electronic Industries Alliance Standard 310-D, "Cabinets, Racks, Panels, and Associated Equipment", (September, 1992).

The racks 10 are intended to be used in pairs to support opposing ends of electronic components. The rack 10 is intended to be attached to a supporting floor by bolts extending through the base 20.

Figure 4:
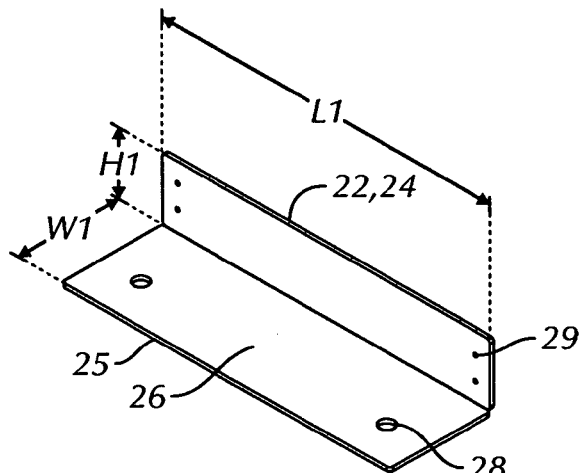
FIG. 4 is a perspective view of a first embodiment of a base bracket for use in the relay rack assembly of FIG. 1.
Figure 5:
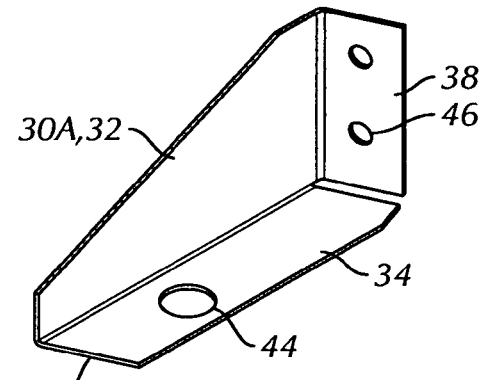
FIG. 5 is a perspective view of a first embodiment of a support bracket of the relay rack assembly of FIG. 1.
Figure 6:
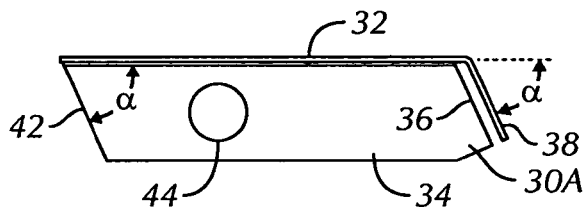
FIG. 6 is a top plan view of the support bracket of FIG. 5.
Figure 7:
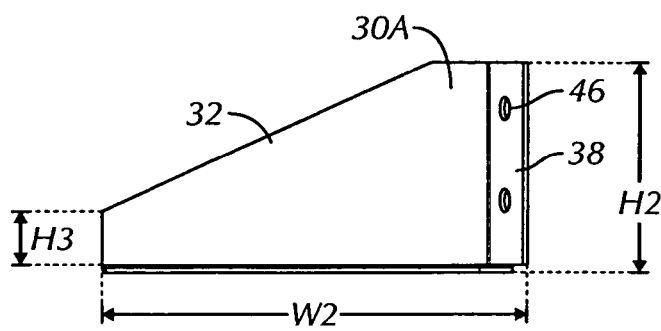
FIG. 7 is a side view of the support bracket of FIG. 5.
Figure 8:
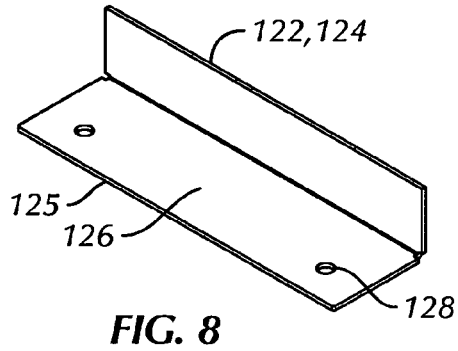
FIG. 8 is a perspective view of a second embodiment of a base bracket for use in the relay rack assembly of FIG. 1.
Figure 9:
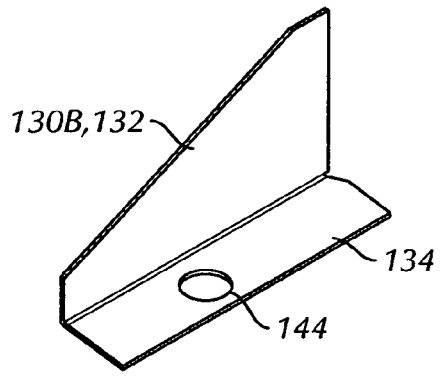
FIG. 9 is a perspective view of a second embodiment of a support bracket for use in the relay rack assembly of FIG. 1.
Figure 10:
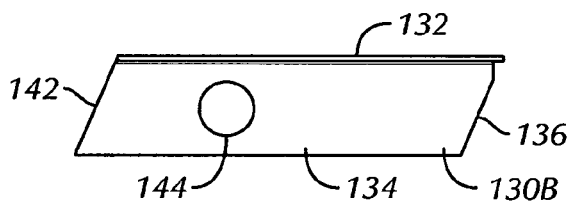
FIG. 10 is a top plan view of the support bracket of FIG. 9.
Figure 11:
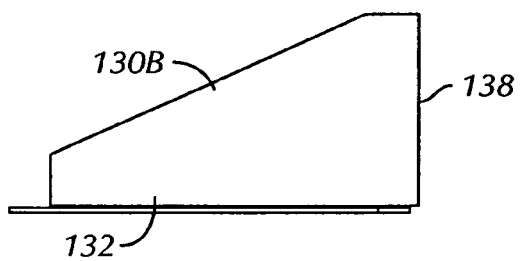
FIG. 11 is a side view of the support bracket of FIG. 9.
Figure 12:
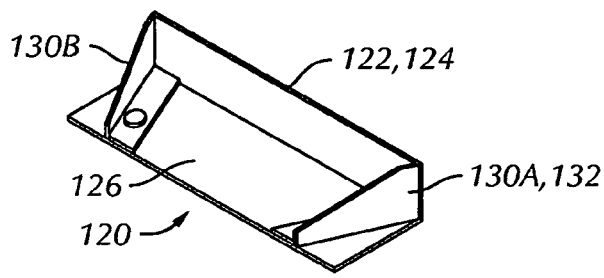
FIG. 12 is a perspective view of a second embodiment of a base assembly for use in the relay rack assembly of FIG. 1.

The base 20 includes two base brackets 22 which each have a vertical flange 24 and a horizontal flange 26. The vertical and horizontal flanges 24, 26 are preferably formed as an integral, one-piece unit. The vertical flange 24 is preferably approximately 4 inches in height H1 and the horizontal flange 26 is preferably approximately 6 inches in width W1. The vertical and horizontal flanges both have a length L1 preferably in the range of about 19 inches to about 24 inches. In one preferred embodiment, the length L1 is about 21 inches. The bracket is preferably made from 14 gauge cold-rolled or hot-rolled sheet steel, although it will be appreciated that other materials having the appropriate strength, stiffness, machining, and cost characteristics, such as aluminum, could be substituted. Each bracket 22 is preferably fabricated as a bent angle or extrusion. Each bracket 22 also includes at least two mounting holes 28 formed in the horizontal flange 26, as well as two or more (four are shown in FIG. 4) mounting holes 29 formed in the vertical flange 24. In one preferred embodiment, the horizontal flange mounting holes 28 have a diameter of approximately 0.875 inches. Furthermore, the vertical flange mounting holes 29 are preferably 0.375" in diameter. These dimensions are for one preferred embodiment and, it is to be understood that the invention is by no means limited to these dimensions.

With particular reference now to FIGS. 3 and 5–7, the base 20 also includes at least two support brackets 30A and 30B (collectively, "support brackets 30") on each of the base brackets 22. The support brackets 30 each preferably include a vertical support 32 and a horizontal support 34. A vertical end support 38 extends from the vertical support 32 and is adapted to mate with the vertical flange 24 of the base bracket 22. The vertical end support 38 is provided with mounting holes 46 corresponding in size, position, and number to the vertical flange mounting holes 29. Bolts extending through mounting holes 29 and 46 allow the base brackets 22 to be attached to the lower ends of the uprights 12.

The horizontal support 34 has a first edge 36 and a second edge 42. Both edges 36, 42 are angled relative to the vertical support 32 at an angle α (see FIG. 6). The vertical end support 38 extends generally parallel to the first edge 36, and is consequently also oriented relative to the vertical support 32 at the angle α. With these angular orientations and by proper dimensioning of the width W2 of the support brackets 30A and 30B, with the vertical end support 38 assembled adjacent the vertical flange 24, the second edge 42 is substantially even with a forward edge 25 of the horizontal flange (see FIG. 3).

In order to eliminate unnecessary material (since the loading applied to the vertical support 32 decreases from the portion of the vertical support near the first edge 36 to the portion of the vertical support near the second edge 42), in one preferred embodiment of the invention, the height of the vertical support varies from a maximum height H2 proximate the first edge 36 of about 4 inches to a minimum height H3 proximate the second edge 42 of about 1 inch.

Figure 3:
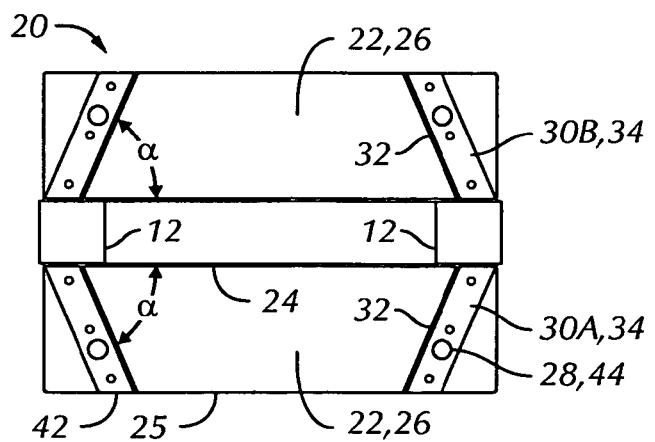
FIG. 3 is a partially schematic cross-sectional view of the relay rack assembly of FIG. 1 taken along line 3—3 of FIG. 2.

With particular reference now to FIG. 3, the support brackets 30A and 30B are mounted to the base bracket 22 such that the vertical support 32 forms the angle α with respect to vertical flange 24. The angle α is preferably between about 60 and about 85 degrees, and more preferably is about 67 degrees. Thus, the vertical supports 32 on support brackets 30A and 30B "toe-in", or extend convergently toward one another in the direction in which the horizontal base flange 26 extends from the vertical base flange 24.

The support brackets 30 are preferably made from 14 gauge steel sheet. The support bracket can be made from any conventional manufacturing process such as extrusion, casting or welding, but is more preferably formed from sheet stock which is formed by bending into the desired configuration.

At least one mounting hole 44 is formed in the horizontal support 34. The mounting hole 44 preferably has a diameter of approximately 0.875 inches and is located so as to align with the mounting hole 28 in the horizontal flange 26 when the support bracket 30 is assembled with the base bracket 22. The base assembly 20 is connected to a supporting surface by bolts extending through mounting holes 28 and 44.

The support brackets 30 may be attached to the base bracket 22 though any conventional means. Preferably, the support bracket 30 is spot welded to the base bracket 22. It will be appreciated that the support bracket 30 could be assembled with the base bracket 22 in a variety of ways, including, for example, solely by the bolts extending through mounting holes 28, 44 and/or mounting holes 29, 46, or by seam welding.

In use, the base brackets 22 are shipped disassembled from the uprights 12 and cross-bracket 14. The relay rack 10 is assembled in the field, with the base brackets 22 being bolted into place on a supporting floor, and the base brackets secured to the lower ends of the uprights 12 by bolts extending through mounting holes 29 and 46 (as well as through corresponding mounting holes in the lower ends of the uprights 12). Alternatively, the relay rack 10 could be shipped in an assembled condition, with the base brackets 22 connected to the uprights 12.

With reference now to FIGS. 8–12, a second embodiment base assembly 120 differs from the first embodiment base assembly 20 primarily in that a pair of second embodiment support brackets 130A and 130B (collectively, "support brackets 130") omit the vertical end supports 38 and are configured such that horizontal supports 134 extend laterally inward toward one another (toward a central axis of the base bracket 122, see FIG. 12) when assembled with the second embodiment base bracket 122. In contrast, first embodiment horizontal supports 34 extend laterally outward away from one another (away from a central axis of the base bracket 22, see FIG. 3) when assembled with the first embodiment base bracket 22. The support brackets 130 may be attached to the second embodiment base bracket 122 in a number of ways, including seam welding horizontal support 134 to the base bracket horizontal flange 126 and seam welding vertical support 132 to base bracket vertical flange 124 along edge 138. Alternatively, the support brackets 130A, 130B could be connected to the base bracket 122 by fasteners installed in mounting holes 128, 144. Vertical support 132 need not be directly connected to the vertical flange 124, but could simply be allowed to bear against the vertical flange 124 as the uprights 12 deflect and push the vertical flanges 124 into contact with the vertical supports 132.

With the vertical end support 38 omitted, the second embodiment support brackets 130 are substantially in the shape of an "L".

The second embodiment base assembly 120 is otherwise similar to the first embodiment base assembly 20. In particular, the second embodiment support bracket 130 is preferably sized such that when assembled with base bracket 122, a forward edge 142 of the horizontal support 134 is substantially even with a forward edge 125 of the horizontal flange 126.

The first and second embodiments described above each provide a unique structural base for supporting a relay rack. The mounting of the support brackets 30, 130 on an angle provides significant benefits over prior designs. First, the use of support brackets allows for the base bracket 22, 122 to be made from thinner material since at least part of the load is carried by the support brackets 30, 130. The thinner material results in a significant amount of weight savings. This also makes the product easier to ship and to assemble. Thinner material is also easier to fabricate using conventional machines. The orientation of the support brackets 30, 130 is designed to transmit bending of the vertical flange 24, 124 directly into the attachment to the floor through the mounting fastener.

Although the invention has been described and illustrated with respect to the exemplary embodiments thereof, it should be understood by those skilled in the art that the foregoing and various other changes, omissions and additions may be made therein and thereto, without parting from the spirit and scope of the present invention. Accordingly, reference should be made to the appended claims, rather than to the foregoing specification, as indicating the scope of the invention.

What is claimed is:

1. A relay rack for supporting electrical components, the relay rack comprising:
   at least two vertical columns having upper and lower ends;
   an upper cross-bracket extending between and attached to the vertical columns at their upper ends; and a base including:
- first and second base brackets, each base bracket having a vertical base flange attached integrally to a horizontal base flange, the vertical base flanges of the base brackets being respectively attached to opposite sides of the lower ends of the vertical columns, the vertical base flanges each extending along a substantially vertical plane, and
- first and second support brackets connected to each base bracket, each support bracket having a single vertical support and a single horizontal support connected to the vertical support, the vertical support extending along a second substantially vertical plane that forms a dihedral angle of less than 90 degrees with the plane of the vertical base flange, such that in a direction in which the horizontal base flange extends from the vertical base flange, the vertical supports on each base bracket extend convergently toward one another.

2. The relay rack according to claim 1, wherein the first and second support brackets are each substantially L-shaped.

3. The relay rack according to claim 1, wherein the horizontal support of each of the first and second support brackets is welded to the horizontal base flange of the base bracket.

4. The relay rack according to claim 1, wherein each of the first and second support brackets are connected to the base bracket by a fastener.

5. The relay rack according to claim 1, wherein the vertical support of each of the first and second support brackets is connected to the vertical flange of the base bracket.

6. The relay rack according to claim 5, wherein the vertical support of each of the first and second support brackets is welded to the vertical flange of the base bracket.

7. The relay rack according to claim 1, each of the first and second support brackets further including a single vertical end support connected to the support bracket vertical support.

8. A relay rack for supporting electrical components, the relay rack comprising:
- at least two vertical columns having upper and lower ends;
- an upper cross-bracket extending between and attached to the vertical columns at their upper ends; and
- a base including:
  - first and second base brackets, each base bracket having a vertical base flange attached integrally to a horizontal base flange, the vertical base flanges of the base brackets being respectively attached to opposite sides of the lower ends of the vertical columns, the vertical base flanges each extending along a substantially vertical plane, and
  - first and second support brackets connected to each base bracket, each support bracket having a single vertical support, a single vertical end support connected to the vertical support, and a single horizontal support connected to the vertical support, the vertical support extending along a second substantially vertical plane that forms a dihedral angle of less than 90 degrees with the plane of the vertical base flange, such that in a direction in which the horizontal base flange extends from the vertical base flange, the vertical supports on each base bracket extend convergently toward one another.

9. The relay rack according to claim 8, wherein the vertical end support and the horizontal support of each of the first and second support brackets are connected to one of the base brackets.

10. The relay rack according to claim 9, wherein the vertical end support and the horizontal support are connected to the base bracket by spot welding.

11. The relay rack according to claim 8, wherein the vertical support of each of the first and second support brackets is tapered from a first height at a first end to a second, smaller height at a second end.

12. The relay rack according to claim 8, wherein the base brackets and the support brackets are each formed from sheet metal having a thickness less than 0.25 inch.

13. The relay rack according to claim 12, wherein the base brackets and the support brackets are each formed from 14 gauge sheet metal.

14. The relay rack according to claim 8, wherein each of the base brackets includes a number of mounting holes each having a predetermined size and position and the first and second support brackets together include a plurality of mounting holes corresponding in size, number, and position to the base bracket mounting holes.

* * * * *